(12) United States Patent
Hoshino et al.

(10) Patent No.: US 8,594,593 B2
(45) Date of Patent: Nov. 26, 2013

(54) FREQUENCY CONVERTER AND TRANSMITTER

(75) Inventors: Hiroaki Hoshino, Kanagawa-ken (JP); Toshiya Mitomo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 12/880,811

(22) Filed: Sep. 13, 2010

(65) Prior Publication Data
US 2011/0235739 A1  Sep. 29, 2011

(30) Foreign Application Priority Data

Mar. 26, 2010  (JP) ................................ 2010-073702

(51) Int. Cl.
*H01Q 11/12*  (2006.01)
*H04B 1/04*  (2006.01)

(52) U.S. Cl.
USPC ......................................................... 455/118

(58) Field of Classification Search
USPC ................................................. 455/118, 113
See application file for complete search history.

(56) References Cited

U.S. PATENT DOCUMENTS

| | | | | |
|---|---|---|---|---|
| 6,429,736 | B1* | 8/2002 | Parry et al. | 330/2 |
| 7,280,805 | B2* | 10/2007 | Xu et al. | 455/67.11 |
| 7,483,687 | B2* | 1/2009 | Carrez | 455/318 |
| 8,121,577 | B1* | 2/2012 | McKay | 455/326 |
| 2009/0075619 | A1* | 3/2009 | Mitomo et al. | 455/325 |
| 2009/0212839 | A1* | 8/2009 | Chung et al. | 327/307 |

FOREIGN PATENT DOCUMENTS

| | | |
|---|---|---|
| JP | 02-113710 | 4/1990 |
| JP | 2007-174463 | 7/2007 |
| JP | 2009-188954 | 8/2009 |

OTHER PUBLICATIONS

W. Redman-White, et al. 1/f Noise in Passive CMOS Mixers for Low and Zero IF Integrated Receivers, Proceeding of the 27th European Solid-State Circuits Conference, 2001, pp. 41-44.
Japanese Office Action for Japanese Application No. 2010-073702 dated Dec. 20, 2011.

* cited by examiner

*Primary Examiner* — Yuwen Pan
*Assistant Examiner* — Fatuma Sherif
(74) *Attorney, Agent, or Firm* — Turocy & Watson, LLP

(57) ABSTRACT

A frequency converter includes a first pair of transistors including first and second transistors, a second pair of transistors including third and fourth transistors, and a variable impedance circuit. The first transistor includes source terminal being connected to positive-phase input terminal, drain terminal being connected to positive-phase output terminal, and gate terminal being supplied with positive-phase local signal. The second transistor includes source terminal being connected to positive-phase input terminal, drain terminal being connected to negative-phase output terminal, and gate terminal being supplied with negative-phase local signal. The third transistor includes source terminal being connected to negative-phase input terminal, drain terminal being connected to positive-phase output terminal, and gate terminal being supplied with negative-phase local signal. The fourth transistor includes source terminal being connected to negative-phase input terminal, drain terminal being connected to negative-phase output terminal, and gate terminal being supplied with positive-phase local signal.

3 Claims, 10 Drawing Sheets

FREQUENCY CONVERTER AND TRANSMITTER

CROSS-REFERENCE TO RELATED APPLICATION

This application is based upon and claims the benefit of priority from Japanese Patent Application No. 2010-073702, filed on Mar. 26, 2010, the entire contents of which are incorporated herein by reference.

FIELD

Embodiments described herein relate generally to a frequency converter and a transmitter.

BACKGROUND

An active-typed double balanced mixer is popular as one of frequency converters for a radio apparatus. Since the active-typed double balanced mixer consumes electricity in a mixer stage, it is difficult to achieve low power consumption. One of the frequency converters having lower power consumption is a passive-typed double balanced mixer. An example of the passive-typed double balanced mixer is disclosed in W. Redman-White, et al., "1/f noise in passive CMOS mixers for low and zero IF integrated receivers," Proceedings of the 27th European Solid-State Circuits Conference, 2001, pp. 41-44.

However, in the passive-typed double balanced mixer disclosed in the above reference, input impedance assessed from the mixer stage decreases because of charging and discharging parasitic capacity of a switching transistor. In recent years, a radio apparatus which is capable of varying frequencies applied to a local signal has been known. In such the radio apparatus, the frequency of the local signal may vary, and such the local signal is inputted into the passive-typed double balanced mixer. As a result, the input impedance of the passive-typed double balanced mixer decreases depending on the frequency of the local signal.

DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

DETAILED DESCRIPTION

Figure 1:
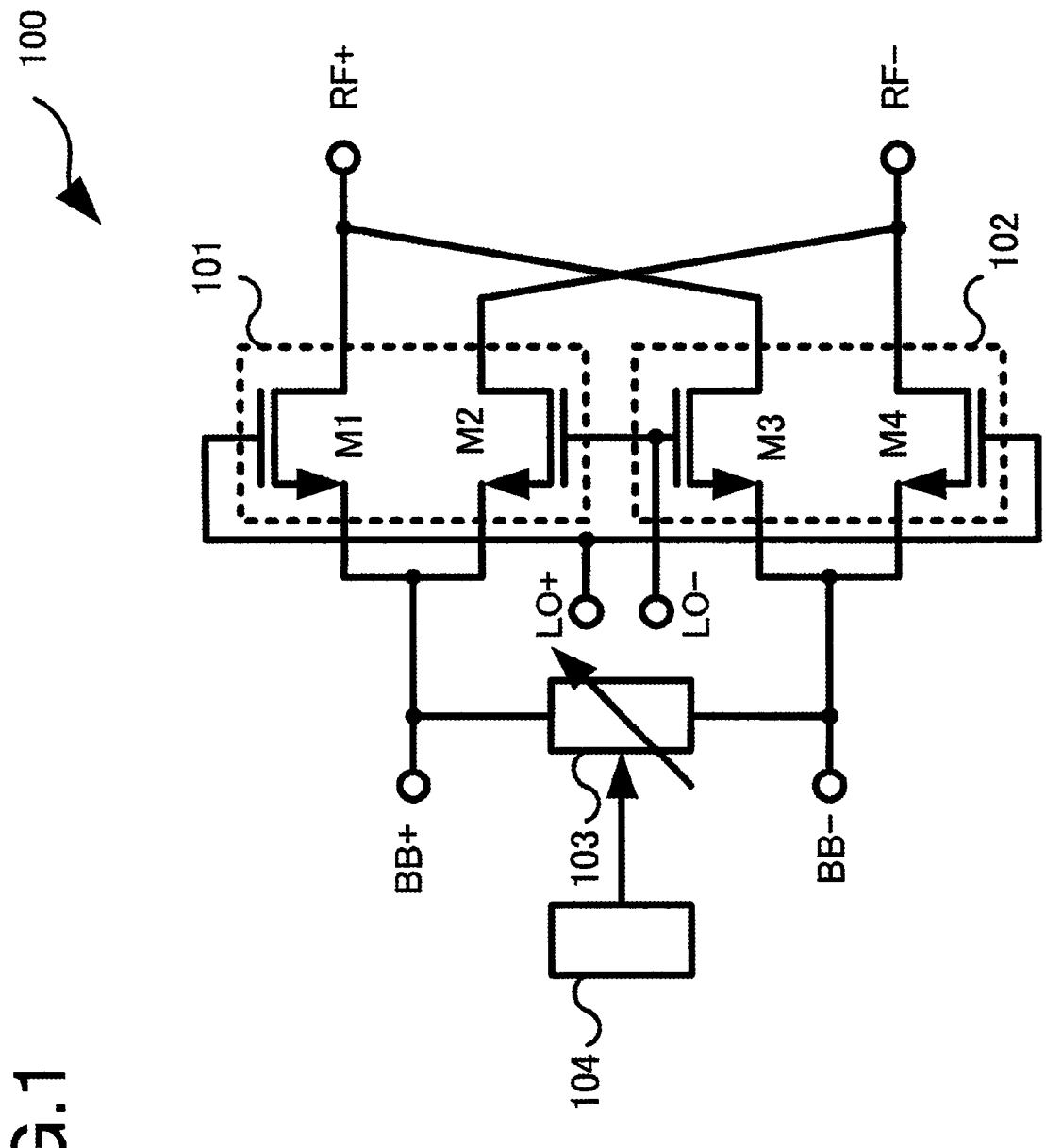
FIG. 1 is a diagram showing a configuration of a frequency converter 100 according to a first embodiment.

According to one aspect of the invention, a frequency converter for converting frequencies of a positive-phase input signal and a negative-phase input signal into other frequencies to obtain a positive-phase output signal and a negative-phase output signal, the positive-phase input signal being inputted into a positive-phase input terminal, the negative-phase input signal being inputted into a negative-phase input terminal, the positive-phase output signal being outputted from a positive-phase output terminal and the negative-phase output signal being outputted from a negative-phase output terminal, includes a first pair of transistors including a first transistor and a second transistor, the first transistor including a source terminal being connected to the positive-phase input terminal, a drain terminal being connected to the positive-phase output terminal, and a gate terminal being supplied with a positive-phase local signal; and the second transistor including a source terminal being connected to the positive-phase input terminal, a drain terminal being connected to the negative-phase output terminal, and a gate terminal being supplied with a negative-phase local signal; a second pair of transistors including a third transistor and a fourth transistor, the third transistor including a source terminal being connected to the negative-phase input terminal, a drain terminal being connected to the positive-phase output terminal, and a gate terminal being supplied with the negative-phase local signal; and the fourth transistor including a source terminal being connected to the negative-phase input terminal, a drain terminal being connected to the negative-phase output terminal, and a gate terminal being supplied with the positive-phase local signal; and a variable impedance circuit having an impedance value depending on frequencies of the positive-phase local signal and the negative-phase local signal, one terminal being connected to the positive-phase input terminal, and other terminal being connected to the negative-phase input terminal.

According to another aspect of the invention, a frequency converter for converting frequencies of a positive-phase input signal and a negative-phase input signal into other frequencies to obtain a positive-phase output signal and a negative-phase output signal, the positive-phase input signal being inputted into a positive-phase input terminal, the negative-phase input signal being inputted into a negative-phase input terminal, the positive-phase output signal being outputted from a positive-phase output terminal and the negative-phase output signal being outputted from a negative-phase output terminal, includes a first pair of transistors configured to converting the frequency of the positive-phase input terminal into other frequency, and including a first transistor and a second transistor, the first transistor including a source terminal being connected to the positive-phase input terminal, a drain terminal being connected to the positive-phase output terminal, and a gate terminal being supplied with a positive-phase local signal; and the second transistor including a source terminal being connected to the positive-phase input terminal, a drain terminal being connected to the negative-phase output terminal, and a gate terminal being supplied with a negative-phase local signal; a second pair of transistors configured to converting the frequency of the negative-phase input terminal into other frequency, and including a third transistor and a fourth transistor, the third transistor including a source terminal being connected to the negative-phase input terminal, a drain terminal being connected to the positive-phase output terminal, and a gate terminal being supplied with the negative-phase local signal; and the fourth transistor including a source terminal being connected to the negative-phase input terminal, a drain terminal being connected to the negative-phase output terminal, and a gate terminal being supplied with the positive-phase local signal; a third pair of transistors configured to converting the frequency of the positive-phase input terminal into other frequency, and including a fifth transistor and a sixth transistor, the fifth transistor including a source terminal being connected to the positive-phase input terminal, a drain terminal being connected to the positive-phase output terminal, and a gate terminal being supplied with a positive-phase local signal; and the sixth transistor including a source terminal being connected to the positive-phase input terminal, a drain terminal being connected to the negative-phase output terminal, and a gate terminal being supplied with a negative-phase local signal; a fourth pair of transistors configured to converting the frequency of the negative-phase input terminal into other frequency, and including a seventh transistor and a eighth transistor, the seventh transistor including a source terminal being connected to the negative-phase input terminal, a drain terminal being connected to the positive-phase output terminal, and a gate terminal being supplied with the negative-phase local signal; and the eighth transistor including a source terminal being connected to the negative-phase input terminal, a drain terminal being connected to the negative-phase output terminal, and a gate terminal being supplied with the positive-phase local signal; and a switch to switch whether or not the third pair of transistors and the fourth pair of transistors convert the frequencies of the positive-phase input signal and the negative-phase input signal into other frequencies, according to frequencies of the positive-phase local signal and the negative-phase local signal.

According to another aspect of the invention, a transmitter, includes a signal processing unit to generate a digital baseband signal; a D/A converter to convert the digital baseband signal into an analog baseband signal; the frequency converter of claim 1 to convert a frequency of the analog baseband signal into other frequency to generate a transmission signal; an amplifier to amplify the transmission signal to generate a radio signal; and an antenna to transmit the radio signal to a destination apparatus.

The embodiments will be explained with reference to the accompanying drawings. Note that, the same reference numerals are given to the same configuration among embodiments, and the description will be omitted.

DESCRIPTION OF THE FIRST EMBODIMENT

FIG. 1 is a diagram showing a configuration of a frequency converter 100 according to a first embodiment. A positive-phase input signal is inputted into a positive-phase input terminal BB+. A negative-phase input signal is inputted into a negative-phase input terminal BB−. A positive-phase local signal is inputted into a positive-phase local terminal LO+. A negative-phase local signal is inputted into a negative-phase local terminal LO−. The frequency converter 100 converts frequencies of the positive-phase input signal and the negative-phase input signal into other frequencies, using the positive-phase local signal and the negative-phase local signal. Then, the frequency converter 100 outputs a positive-phase output signal and a negative-phase output signal from a positive-phase output terminal RF+ and a negative-phase output terminal RF−, respectively.

The frequency converter 100 includes a first pair of transistors 101, a second pair of transistors 102, a variable impedance circuit 103, and a control unit 104. The first pair of transistors 101 converts the frequency of the positive-phase input signal into another frequency. The second pair of transistors 102 converts the frequency of the negative-phase input signal into another frequency. The variable impedance circuit 103 has an impedance value varying depending on the positive-phase local signal and the negative-phase local signal. The control unit 104 controls the variable impedance circuit 103. In the first embodiment, the control unit 104 exists in the frequency converter 100. However, the control unit 104 may exist external of the frequency converter 100.

The first pair of transistors 101 includes a first transistor M1 and a second transistor M2. A source terminal of the first transistor M1 is connected to the positive-phase input terminal BB+. A drain terminal of the first transistor M1 is connected to the positive-phase output terminal RF+. The positive-phase local signal is supplied to a gate terminal of the first transistor M1. A source terminal of the second transistor M2 is connected to the positive-phase input terminal BB+. A drain terminal of the second transistor M2 is connected to the negative-phase output terminal RF−. The negative-phase local signal is supplied to a gate terminal of the second transistor M2.

The second pair of transistors 102 includes a third transistor M3 and a fourth transistor M4. A source terminal of the third transistor M3 is connected to the negative-phase input terminal BB−. A drain terminal of the third transistor M3 is connected to the positive-phase output terminal RF+. The negative-phase local signal is supplied to a gate terminal of the third transistor M3. A source terminal of the fourth transistor M4 is connected to the negative-phase input terminal BB−. A drain terminal of the fourth transistor M4 is connected to the negative-phase output terminal RF−. The positive-phase local signal is supplied to a gate terminal of the fourth transistor M4. Hereinafter, the first to fourth transistors M1 to M4 are referred to as "transistor".

The positive-phase local signal and the negative-phase local signal are generated by an oscillator (not shown). The oscillator supplies the positive-phase local signal and the negative-phase local signal to the frequency converter 100. Hereinafter, both the positive-phase local signal and the negative-phase local signal are referred together to as a "local signal". The oscillator generates various local signals, which each local signal has a different frequency. Accordingly, the local signal having any one of the various frequencies is inputted into the frequency converter 100.

One terminal of the variable impedance circuit 103 is connected to the positive-phase input terminal BB+. Other terminal of the variable impedance circuit 103 is connected to the negative-phase input terminal BB−. An impedance value of the variable impedance circuit 103 varies depending on the frequency of the local signal.

Figure 2:
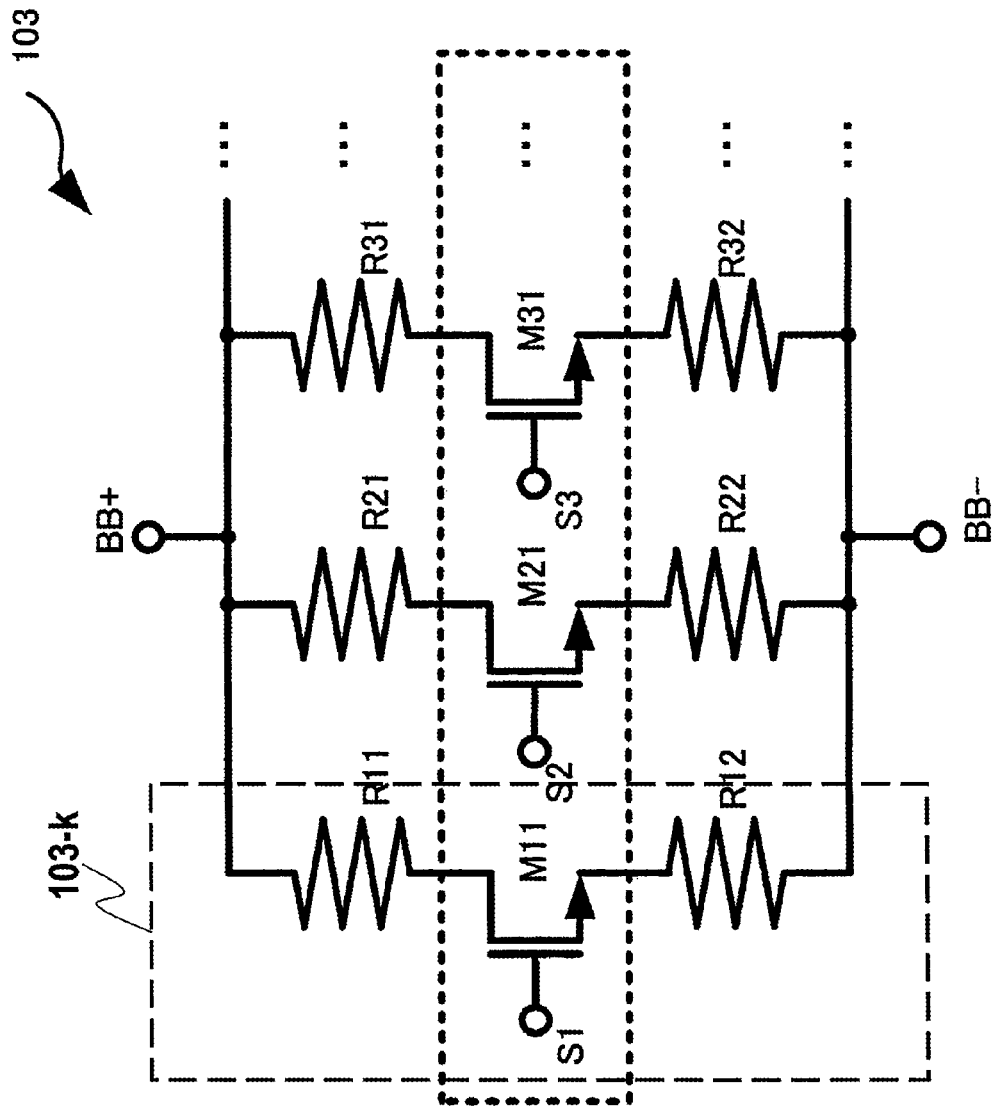
FIG. 2 is a diagram showing an example of a variable impedance circuit 103.

Next, we will explain an example of the variable impedance circuit 103 with reference to FIG. 2. The variable impedance circuit 103 includes a plurality of resistor units 103-$k$ ($k$=1, 2, ..., n: n is an integer which is at least 2). Each of the resistor units 103-$k$ includes a first resistor Rk1, a second resistor Rk2, and a switch Sk. One terminal of the first resistor Rk1 is connected to the positive-phase input terminal BB+. One terminal of the second resistor Rk2 is connected to the negative-phase input terminal BB−. In the example of FIG. 2, a transistor Mk1 is used as the switch Sk. A drain terminal of the transistor Mk1 is connected to other terminal of the first resistor Rk1. A source terminal of the transistor Mk1 is connected to other terminal of the second resistor Rk2. A gate terminal of the transistor Mk1 is connected to the control unit 104. The variable impedance circuit 103 varies the impedance value by turning the transistor Mk1 ON and OFF.

Returning to FIG. 1, operation of the frequency converter 100 will be explained.

The positive-phase input signal is supplied to the source terminal of the first transistor M1 and further to the source terminal of the second transistor M2, from the positive-phase input terminal BB+. The negative-phase input signal is supplied to the source terminal of the third transistor M3 and further to the source terminal of the fourth transistor M4, from the negative-phase input terminal BB−.

In the first transistor M1, the positive-phase input signal is mixed with the positive-phase local signal to obtain a first signal. In the third transistor M3, the negative-phase input signal is mixed with the negative-phase local signal to obtain a third signal. Then, sum of the first signal and the third signal is outputted as the positive-phase output signal from the positive-phase output terminal RF+. The first transistor M1 and the third transistor M3 are alternately activated according to the frequency of the local signal. The third transistor M3 is inactivated while the first transistor M1 is activated. As a result, the first signal is outputted as the positive-phase output signal. On the other hand, the first transistor M1 is inactivated while the third transistor M3 is activated. As a result, the third signal is outputted as the positive-phase output signal. A cycle to switch outputting the first signal and the third signal is determined based on the frequency of the local signal.

In the second transistor M2, the positive-phase input signal is mixed with the negative-phase local signal to obtain a second signal. In the fourth transistor M4, the negative-phase input signal is mixed with the positive-phase local signal to obtain a fourth signal. Then, sum of the second signal and the fourth signal is outputted as the negative-phase output signal from the negative-phase output terminal RF−. The second transistor M2 and the fourth transistor M4 are alternately activated according to the frequency of the local signal. The fourth transistor M4 is inactivated while the second transistor M2 is activated. As a result, the second signal is outputted as the negative-phase output signal. On the other hand, the second transistor M2 is inactivated while the fourth transistor M4 is activated. As a result, the fourth signal is outputted as the negative-phase output signal. A cycle to switch outputting the second signal and the fourth signal is determined based on the frequency of the local signal.

A parasitic capacity Cgd is generated between the gate terminal and the drain terminal of each of the first to fourth transistors M1 to M4. Each of the first to fourth transistors M1 to M4 acts as a switching transistor by repeating to switch between ON and OFF according to the frequency of the local signal. Therefore, the parasitic capacity Cgd acts as a switching capacitor by repeating to charge and discharge according to the frequency of the local signal. An input impedance Z of the frequency converter 100 at between the positive-phase input terminal BB+ and the negative-phase input terminal BB− is expressed as $Z=1/(4*Cgd*fLO)$, where fLO is the frequency of the local signal. The local signal may have any one of the various frequencies, fLO1, fLO2, . . . . Accordingly, the input impedance Z may vary as $1/(4*Cgd*fLO1)$, $1/(4*Cgd*fLO2)$, . . . , according to the frequency fLO1, fLO2, . . . , of the local signal.

Varying the input impedance Z affects a performance of a filter (not shown) which is connected to the frequency converter 100 as a previous stage, for example. To avoid giving influence to the filter, in the frequency converter 100, the control unit 104 controls the switch Sk included in the variable impedance circuit 103 to vary the impedance value of the variable impedance circuit 103. The variable impedance circuit 103 turns each of the switches Sk included in each of the resistor units 103-k ON and OFF to fill a resistance value $R=(1/Z-4fLO*Cgd)^{-1}$, according to an instruction from the control unit 104.

According to the first embodiment, the frequency converter 100 can inhibit reduction of the input impedance due to the first to fourth transistors M1 to M4. Moreover, the frequency converter 100 can keep the input impedance to be constant regardless of varying the frequency fLO of the local signal, by varying the resistance value R of the variable impedance circuit 103 according to the frequency fLO of the local signal, as filling $R=(1/Z-4fLO*Cgd)^{-1}$.

DESCRIPTION OF THE SECOND EMBODIMENT

Figure 3:
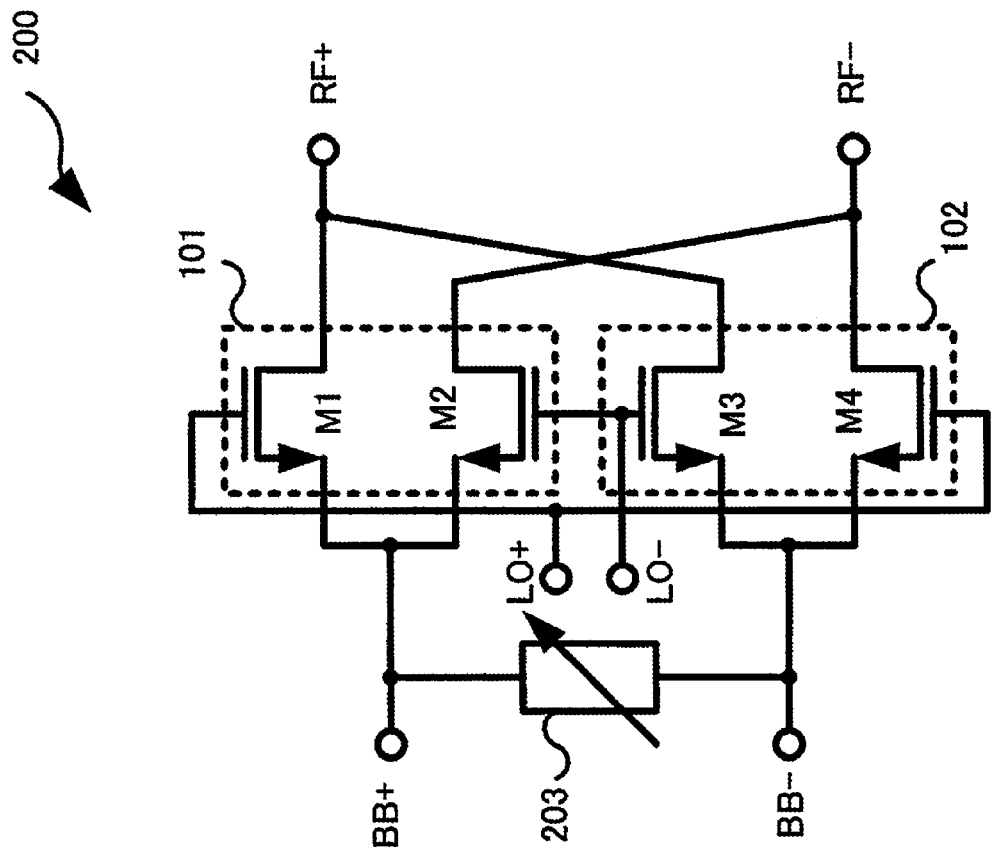
FIG. 3 is a diagram showing a configuration of a frequency converter 200 according to a second embodiment.
Figure 4:
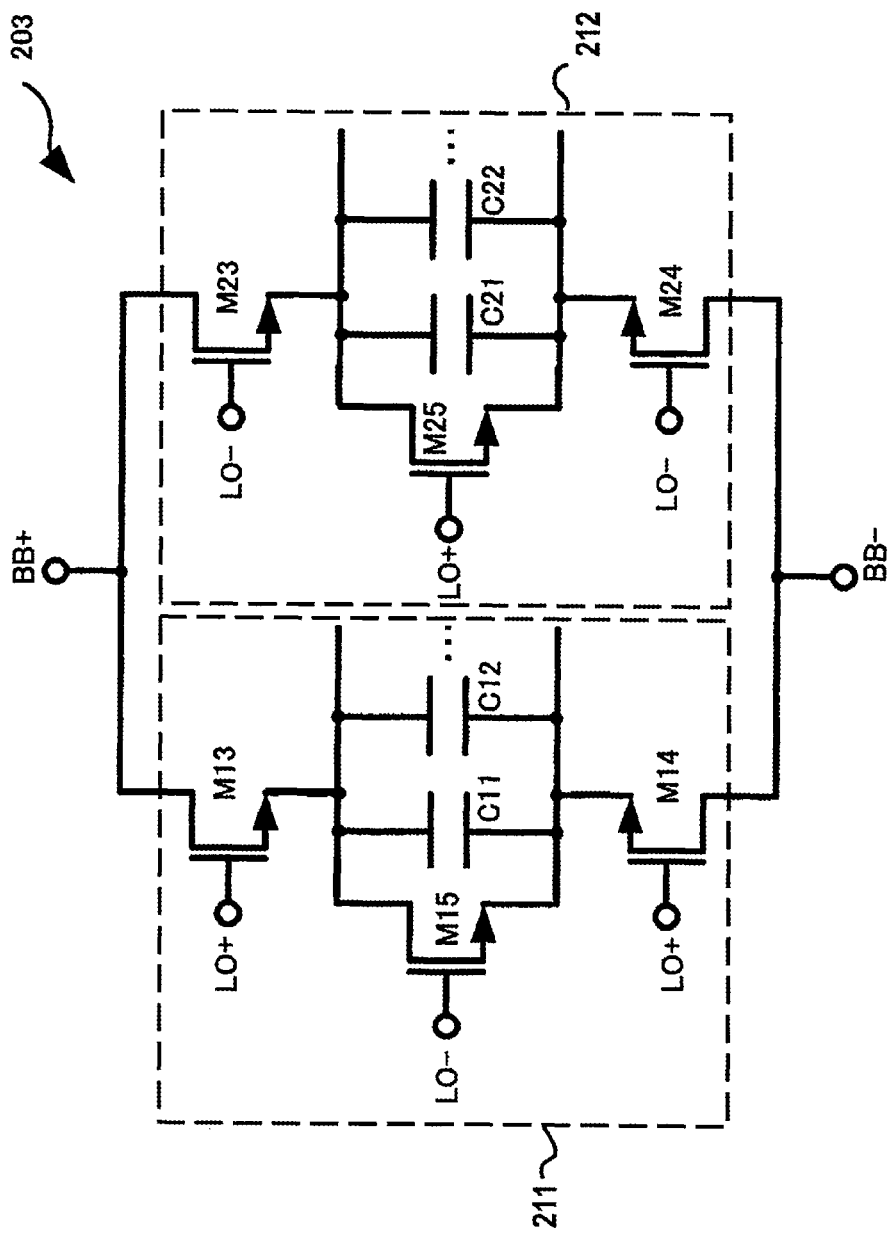
FIG. 4 is a diagram showing an example of a variable impedance circuit 203.

A frequency converter 200 according to a second embodiment is described with reference to FIG. 3. The frequency converter 200 includes a variable impedance circuit 203 shown in FIG. 4 instead of the variable impedance circuit 103 of FIG. 2. Moreover, the frequency converter 200 does not include the control unit 104 of FIG. 1.

The variable impedance circuit 203 includes a first capacitor unit 211 and a second capacitor unit 212.

The first capacitor unit 211 includes a plurality of first capacitors C1k and first to third switch M13 to M15. One terminal of the first switch M13 is connected to the positive-phase input terminal BB+. Other terminal of the first switch M13 is connected to the plurality of the first capacitors C1k. The first switch M13 is turned ON and OFF according to the positive-phase local signal. One terminal of the second switch M14 is connected to the negative-phase input terminal BB−. Other terminal of the second switch M14 is connected to the plurality of the first capacitors C1k. The second switch M14 is turned ON and OFF according to the positive-phase local signal. One terminal of the third switch M15 is connected to the one terminal of the first switch M13. Other terminal of the third switch M15 is connected to the one terminal of the second switch M14. The third switch M15, and the first and second switches M13, M14 are alternately turned ON and OFF according to the negative-phase local signal.

The second capacitor unit 212 includes a plurality of second capacitors C2k and fourth to sixth switches M23 to M25. One terminal of the fourth switch M23 is connected to the positive-phase input terminal BB+. Other terminal of the fourth switch M23 is connected to the plurality of the second capacitors C2k. The fourth switch M23 is turned ON and OFF according to the negative-phase local signal. One terminal of the fifth switch M24 is connected to the negative-phase input terminal BB−. Other terminal of the fifth switch M24 is connected to the plurality of the second capacitors C2k. The fifth switch M24 is turned ON and OFF according to the negative-phase local signal. One terminal of the sixth switch M25 is connected to the one terminal of the fourth switch M23. Other terminal of the sixth switch M25 is connected to the one terminal of the fifth switch M24. The sixth switch M25, and the fourth and fifth switches are alternately turned ON and OFF according to the positive-phase local signal.

The first capacitor unit 211 and the second capacitor unit 212 act as a switching capacitor by repeating to charge and discharge according to the frequency of the local signal. The capacitance value of the first capacitor unit 211 and the second capacitor unit 212 varies depending on the frequency of the local signal. Here, sum of the capacities of the first capacitors C1k included the first capacitor unit 211 and the capacities of the second capacitors C2k included the second capacitor unit 212 is referred to as Cv. The first and second capacitors C1$k$, C2$k$ are set as filling Cv=1/(Z*fLO)−4Cgd, where Z is an input impedance value of the frequency converter 200. Moreover, the input impedance value Z is determined depending on an output impedance of a circuit which is connected to the frequency converter 200 as a previous stage. The input impedance value Z can be set to become an intended value regardless the frequency of the local signal fLO by setting Cv to fill the above equation.

According to the second embodiment, the frequency converter 200 can achieve same effects as them of the frequency converter 100 of the first embodiment. Moreover, the frequency converter 200 can omit controlling the variable impedance circuit 203 by setting capacitances of the capacitors C1$k$, C2$k$, as that the input impedance value Z achieves the intended value when designing the frequency converter 200.

DESCRIPTION OF THE THIRD EMBODIMENT

A frequency converter 300 according to a third embodiment is described with reference to FIG. 5. The frequency converter 300 is different from the frequency converter 100 of the first embodiment in that the frequency converter 300 does not include the variable impedance circuit 103. The frequency converter 300 includes 5-s-th to 8-s-th transistors M31$s$ to M34$s$ ($s$=1, 2, ..., m: m is an integer which is equal to or larger than 1). The frequency converter 300 selects transistors to be connected to the positive-phase output terminal RF+ among 5-s-th transistors M31$s$, 7-s-th transistors M33$s$, a first transistor M1, and a third transistor M3, by using a 5-1-th switching unit S311, a 7-1-th switching unit S331, a 5-2-th switching unit S312, and a 7-2-th switching unit S332, in order to keep the input impedance of the frequency converter 300 to be constant. The frequency converter 300 also selects transistors to be connected to the negative-phase output terminal RF− among 6-s-th transistors M32$s$, 8-s-th transistors M34$s$, a second transistor M2, and a fourth transistor M4, by using a 6-1-th switching unit S321, a 8-1-th switching unit S341, a 6-2-th switching unit S322, and a 8-2-th switching unit S342, in order to keep the input impedance of the frequency converter 300 to be constant.

A source terminal of each of the first transistor M1 and the 5-s-th transistors M31$s$ is connected to the 5-1-th switching unit S311. A drain terminal of each of the first transistor M1 and the 5-s-th transistors M31$s$ is connected to the 5-2-th switching unit S312. The positive-phase local signal is supplied to a gate terminal of each of the first transistor M1 and the 5-s-th transistors M31$s$. One terminal of the 5-1-th switching unit S311 is connected to the positive-phase input terminal BB+. The 5-1-th switching unit S311 selects a transistor to be connected to the positive-phase input terminal BB+ among the first transistor M1 and the 5-s-th transistors M31$s$, according to an instruction from a control unit (not shown). One terminal of the 5-2-th switching unit S312 is connected to the positive-phase output terminal RF+. The 5-2-th switching unit S312 selects a transistor to be connected to the positive-phase output terminal RF+ among the first transistor M1 and the 5-s-th transistors M31$s$, according to an instruction from a control unit (not shown). The 5-1-th switching unit S311 and the 5-2-th switching unit S312 select a same transistor.

A source terminal of each of the second transistor M2 and the 6-s-th transistors M32$s$ is connected to the 6-1-th switching unit S321. A drain terminal of each of the second transistor M2 and the 6-s-th transistors M32$s$ is connected to the 6-2-th switching unit S322. The positive-phase local signal is supplied to a gate terminal of each of the second transistor M2 and the 6-s-th transistors M32$s$. One terminal of the 6-1-th switching unit S321 is connected to the positive-phase input terminal BB+. The 6-1-th switching unit S321 selects a transistor to be connected to the positive-phase input terminal BB+ among the second transistor M2 and the 6-s-th transistors M32$s$, according to an instruction from a control unit (not shown). One terminal of the 6-2-th switching unit S322 is connected to the negative-phase output terminal RF−. The 6-2-th switching unit S322 selects a transistor to be connected to the negative-phase output terminal RF− among the second transistor M2 and the 6-s-th transistors M32$s$, according to an instruction from a control unit (not shown). The 6-1-th switching unit S321 and the 6-2-th switching unit S322 select a same transistor.

A source terminal of each of the third transistor M3 and the 7-s-th transistors M33$s$ is connected to the 7-1-th switching unit S331. A drain terminal of each of the third transistor M3 and the 7-s-th transistors M33$s$ is connected to the 7-2-th switching unit S332. The positive-phase local signal is supplied to a gate terminal of each of the third transistor M3 and the 7-s-th transistors M33$s$. One terminal of the 7-1-th switching unit S331 is connected to the negative-phase input terminal BB−. The 7-1-th switching unit S331 selects a transistor to be connected to the negative-phase input terminal BB− among the third transistor M3 and the 7-s-th transistors M33$s$, according to an instruction from a control unit (not shown). One terminal of the 7-2-th switching unit S332 is connected to the positive-phase output terminal RF+. The 7-2-th switching unit S332 selects a transistor to be connected to the positive-phase output terminal RF+ among the third transistor M3 and the 7-s-th transistors M33$s$, according to an instruction from a control unit (not shown). The 7-1-th switching unit S331 and the 7-2-th switching unit S332 select a same transistor.

A source terminal of each of the fourth transistor M4 and the 8-s-th transistors M34$s$ is connected to the 8-1-th switching unit S341. A drain terminal of each of the fourth transistor M4 and the 8-s-th transistors M34$s$ is connected to the 8-2-th switching unit S342. The positive-phase local signal is supplied to a gate terminal of each of the fourth transistor M4 and the 8-s-th transistors M34$s$. One terminal of the 8-1-th switching unit S341 is connected to the negative-phase input terminal BB−. The 8-1-th switching unit S341 selects a transistor to be connected to the negative-phase input terminal BB− among the fourth transistor M4 and the 8-s-th transistors M34$s$, according to an instruction from a control unit (not shown). One terminal of the 8-2-th switching unit S342 is connected to the negative-phase output terminal RF−. The 8-2-th switching unit S342 selects a transistor to be connected to the negative-phase output terminal RF− among the fourth transistor M4 and the 8-s-th transistors M34$s$, according to an instruction from a control unit (not shown). The 8-1-th switching unit S341 and the 8-2-th switching unit S342 select a same transistor.

In the third embodiment, the 5-1-th to 8-1-th transistors M311 to M341 have a same transistor size. Similarly, the 5-s-th to 8-s-th transistors M31$s$ to M34$s$ have a same transistor size ($s$=2, 3, ..., m).

Figure 6:
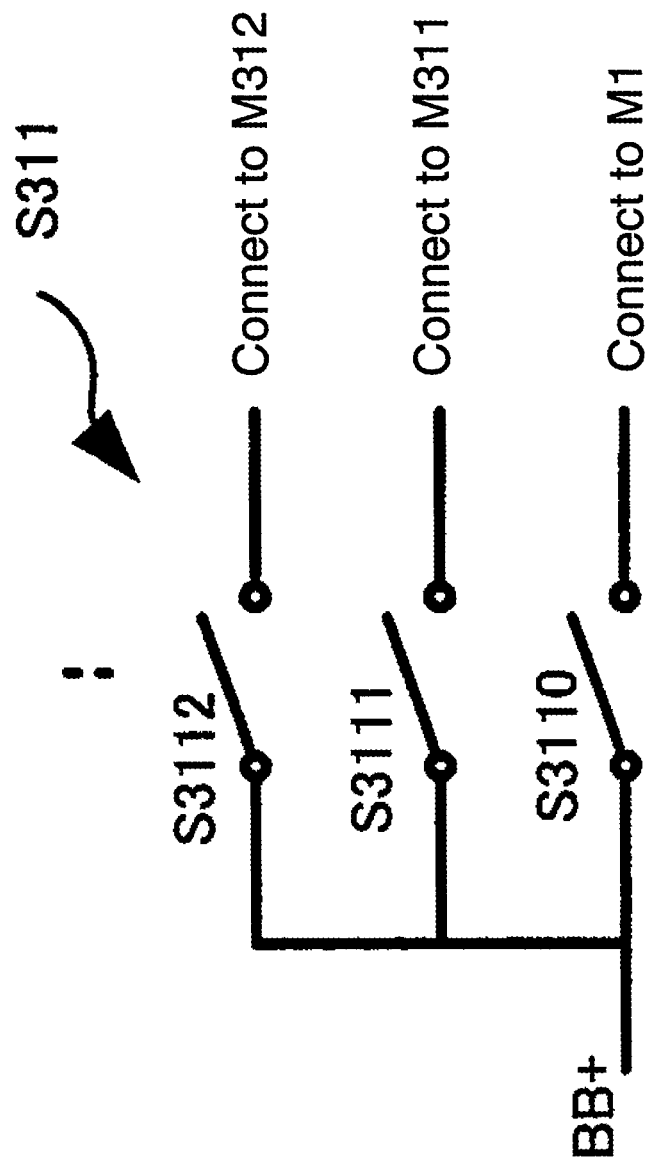
FIG. 6 is a diagram showing an example of a 5-1-th switching unit S311.

Next, we will explain an example of the 5-1-th switching unit S311 with reference to FIG. 6. Since each of the 6-1-th to 8-1-th switching units S321 to S341 and the 5-2-th to 8-2-th switching units S312 to S342 has a same configuration as that of the 5-1-th switching unit S311, the descriptions will be omitted. Hereinafter, the 5-1-th to 8-1-th switching units S311 to S341 and the 5-2-th to 8-2-th switching units S312 to S342 are called as a "switch".

The 5-1-th switching unit S311 includes a plurality of 5-1$k$-th switches S311$k$ ($k$=0, 1, 2, ..., m). One terminal of the 5-10-th switch S3110 is connected to the positive-phase input terminal BB+. Other terminal of the 5-10-th switch S3110 is connected to the first transistor M1. One terminal of the 5-1s-th switch S311s is connected to the one terminal of the 5-10-th switch S3110. Other terminal of the 5-1s-th switch S311s is connected to the 5-s-th transistor M31s.

One of the 5-1k-th switches S311k is turned on and the other of the 5-1k-th switches S311k is turned off, according to an instruction from a control unit (not shown). (m+1) local signals are inputted into the frequency converter 300. Each of the (m+1) local signals has a different frequency from other frequencies. Here, one of the (m+1) local signals, which is a local signal LOk having a frequency fLOk, is inputted into the frequency converter 300. The 5-1-th switching unit S311 turns on the 5-1k-th switches S311k and turns off the other switches. For example, when k=0, a local signal LO0 having a frequency fLO0 is inputted into the frequency converter 300. In this case, the 5-1-th switching unit S311 turns on the 5-10-th switches S3110 and turns off the other switches which are the 5-11-th to 5-1m-th switching units S315 to S311m. As a result, the first transistor M1 is connected to the positive-phase input terminal BB+. Thus, if the local signal LO0 having the frequency fLO0 is inputted into the frequency converter 300, the first to fourth transistors M1 to M4 are connected to the positive-phase or negative-phase input terminal BB+, BB− and the positive-phase or negative-phase output terminals RF+, RF−. The first to fourth transistors M1 to M4 mix the positive-phase or negative-phase input signal with the positive-phase or negative-phase local signal to generate an output signal.

If the local signal LOs having a frequency fLOs is inputted into the frequency converter 300, the 5-s-th to 8-s-th transistors M31s to M34s are connected to the positive-phase or negative-phase input terminal and the positive-phase or negative-phase output terminal by the switch. The 5-s-th to 8-s-th transistors M31s to M34s mix the positive-phase or negative-phase input signal with the positive-phase or negative-phase local signal to generate an output signal.

The first to fourth transistors M1 to M4 have a different transistor size from that of the 5-s-th to 8-s-th transistors M31s to M34s. In the third embodiment, the transistor size of the first to fourth transistors M1 to M4 is a size to satisfy that the parasitic capacity is Cgd0. In this case, the input impedance Z fills Z=1/(4*Cgd0*fLO0). A circuit which is connected to the frequency converter 300 in a previous stage has an output impedance which is adjusted according to the input impedance Z of the frequency converter 300. The transistor size of the 5-s-th to 8-s-th transistors M31s to M34s is a size filling the parasitic capacity Cgds=(fLO0/fLOs)*Cgd0.

According to the third embodiment, when the transistor size of the 5-s-th to 8-s-th transistors M31s to M34s is a size filling the parasitic capacity Cgds=(fLO0/fLOs)*Cgd0, if the local signal LOk having a frequency fLOk is inputted into the frequency converter 300, the switch operates to turn on the 5-1k-th to 8-1k-th switches and the 5-2k-th to 8-2k-th switches. Accordingly, even if the frequency fLOk of the local signal fLOk varies, the input impedance Z of the frequency converter 300 can keep filling Z=1/(4*Cgd0*fLO0).

In the third embodiment, the input impedance Z is filling Z=1/(4*Cgd0*fLO0). However, the input impedance Z may fill Z=1/(4*Cgdk*fLOk). In this case, the transistor size of each of the first to fourth transistors M1 to M4 and the 5-s-th to 8-s-th transistors M31s to M34s is set to fill the parasitic capacity Cgd0=(fLOk/fLO0)*Cgdk and Cgds=(fLOk/fLOs)*Cgdk. (k=0, 1, 2, . . . , m; s=1, 2, . . . , m).

Moreover, the frequency converter 300 needs to include the 5-2-th to 8-2-th switching units S312 to S342 in order to keep the input impedance Z to be constant. On the other hand, the frequency converter 300 may not include the 5-1-th to 8-1-th switching units S311 to S341. This is because that the parasitic capacity Cgdk is generated at between a drain terminal and a gate terminal of a transistor. If one terminal of the parasitic capacity (in the third embodiment, it is a drain terminal) is opened, effect gave to the frequency converter 300 by the parasitic capacity can be reduced. However, other parasitic capacity giving smaller effect may be generated at between other terminals in a transistor, except between the drain terminal and the gate terminal. The frequency converter 300 can reduce the effect due to the other parasitic capacity generated at between other terminals by including the 5-1-th to 8-1-th switching units S311 to S341.

Modified Example

A modified example of the third embodiment is described with reference to FIG. 7. A frequency converter 400 (not shown) according to the modified example has a same configuration as that of the frequency converter 300, except for configuration of the switch, operation of the switch, and transistor sizes of the 5-s-th to 8-s-th transistors M31s to M34s.

Figure 7:
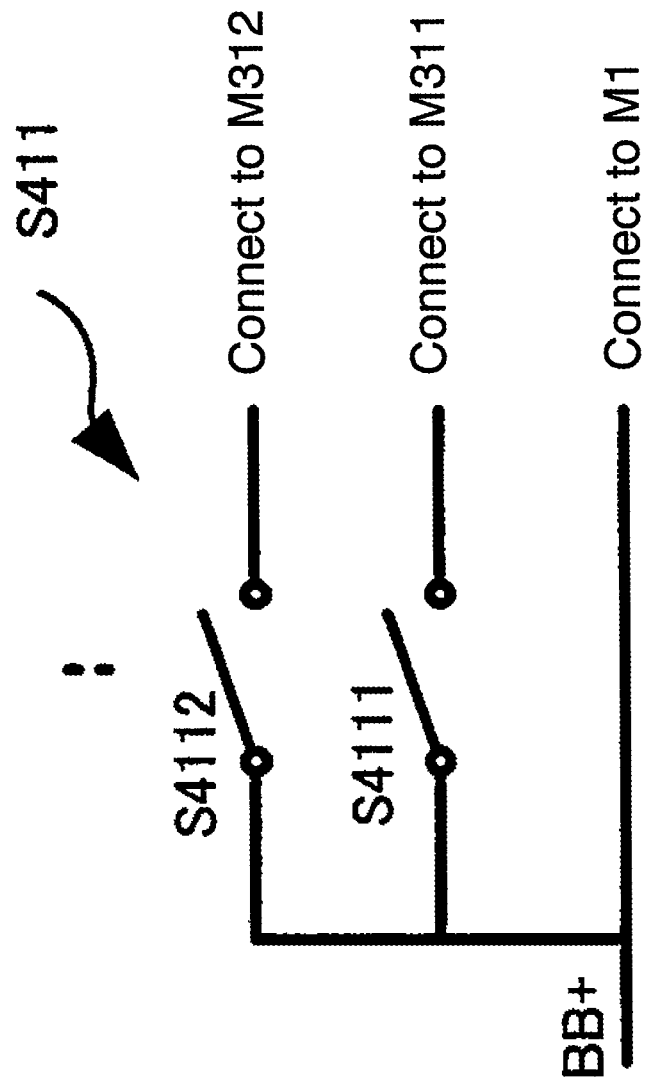
FIG. 7 is a diagram showing an example of a 5-1-th switching unit S411.

FIG. 7 is a diagram showing an example of a 5-1-th switching unit S411. The 5-1-th switching unit S411 includes a 5-1s-th switch S411s. One terminal of the 5-1s-th switch S411s is connected to the positive-phase input terminal BB+. The other terminal of the 5-1-th switching unit S4111 is connected to the 5-s-th transistor M31s. The first transistor M1 is always connected to the positive-phase input terminal BB+ through the 5-1-th switching unit S411.

While the frequency converter 300 selects one transistor according to the frequency of the local signal, the frequency converter 400 selects at least one transistor according to the frequency of the local signal.

If the local signal having the frequency fLO0 is inputted into the frequency converter 400, the switch turns off all the 5-1s-th and 8-2s-th switches S411s to S442s. This means that only the first to fourth transistors M1 to M4 are connected to the input terminal and the output terminal.

If the local signal having the frequency fLOs is inputted into the frequency converter 400, the 5-11-th to the 5-1s-th switches S4111 to S411s are turned on and the 5-1(s+1)-th to 5-m-th switches S411(s+1) to S411m are turned off (s=1, 2, . . . , m−1). When s=m, all the 5-11-th to 5-m-th switches S4111 to S411m are turned on. Other switches are also turned on. Accordingly, the 5-1-th to 5-s-th, the 6-1-th to 6-s-th, the 7-1-th to 7-s-th, and the 8-1-th to 8-s-th transistors are connected to the input terminal and the output terminal (s=1, 2, . . . , m).

The positive-phase input signal is mixed with the positive-phase local signal at each of the first transistor M1 and the 5-1-th to 5-s-th transistors M311 to M341 to obtain mixed signals. The mixed signals are summed to obtain a first signal. The negative-phase input signal is mixed with the negative-phase local signal at each of the third transistor M3 and the 7-1-th to 7-s-th transistors M331 to M33s to obtain mixed signals. The mixed signals are summed to obtain a third signal. At last, the first signal and the third signal are summed to obtain the positive-phase output signal.

The positive-phase input signal is mixed with the negative-phase local signal at each of the second transistor M2 and the 6-1-th to 6-s-th transistors M321 to M32s to obtain mixed signals. The mixed signals are summed to obtain a second signal. The negative-phase input signal is mixed with the positive-phase local signal at each of the fourth transistor M4 and the 8-1-th to 8-s-th transistors M341 to M34s to obtain mixed signals. The mixed signals are summed to obtain a fourth signal. At last, the second signal and the fourth signal are summed to obtain the negative-phase output signal.

Next, we will explain the transistor size of each of the transistor. The transistor size of the first to fourth transistors M1 to M4 is same as that of the frequency converter 300. The output impedance from a circuit of the previous stage is same as that of the third embodiment. Since each of the 6-s-th to 8-s-th transistors S32s to S34s has a same size as that of the 5-s-th transistor M31s, the description will be omitted.

When the 5-s-th transistor M31s is connected to the input terminal and the output terminal, a total parasitic capacity at between the drain terminal and the gate terminal of each of the first transistor M1 and the 5-s-th transistor M31s becomes sum of the parasitic capacities of the first transistor M1 and the 5-s-th transistor M31s. This is because that the parasitic capacity of each of the transistor is seem to be connected in parallel to others. The number of the 5-s-th transistors M31s may be at least one. For example, when the 5-1-th and 5-2-th transistors are connected to the input terminal and the output terminal, the total parasitic capacity Cgd is expressed as Cgd=Cgd0+Cdg1+Cgd2.

The transistor size of the 5-s-th transistor M31s is set to fill $fLOs/fLO0 = Cgd0/(\Sigma_{p=1}^{s} Cgdp)$, where $fLO0 < fLO1 < fLO1 < \ldots < fLOm$.

The parasitic capacity of the transistor having smaller size at between the drain terminal and the gate terminal becomes smaller. According to the modified example, the transistor size of the 5-s-th transistor M31s can be smaller by connecting the transistors to the input terminal and the output terminal. Accordingly, circuit size of the frequency converter 400 can also be smaller.

DESCRIPTION OF THE FOURTH EMBODIMENT

A frequency converter 500 according to a fourth embodiment is described with reference to FIG. 8. As described in the third embodiment, the frequency converter 300 reduces effect of the parasitic capacity of between a drain terminal and a gate terminal of a transistor by opening the drain terminal. On the other hand, in the fourth embodiment, the frequency converter 500 reduces effect of the parasitic capacity of between a drain terminal and a gate terminal of a transistor by opening the gate terminal.

Figure 5:
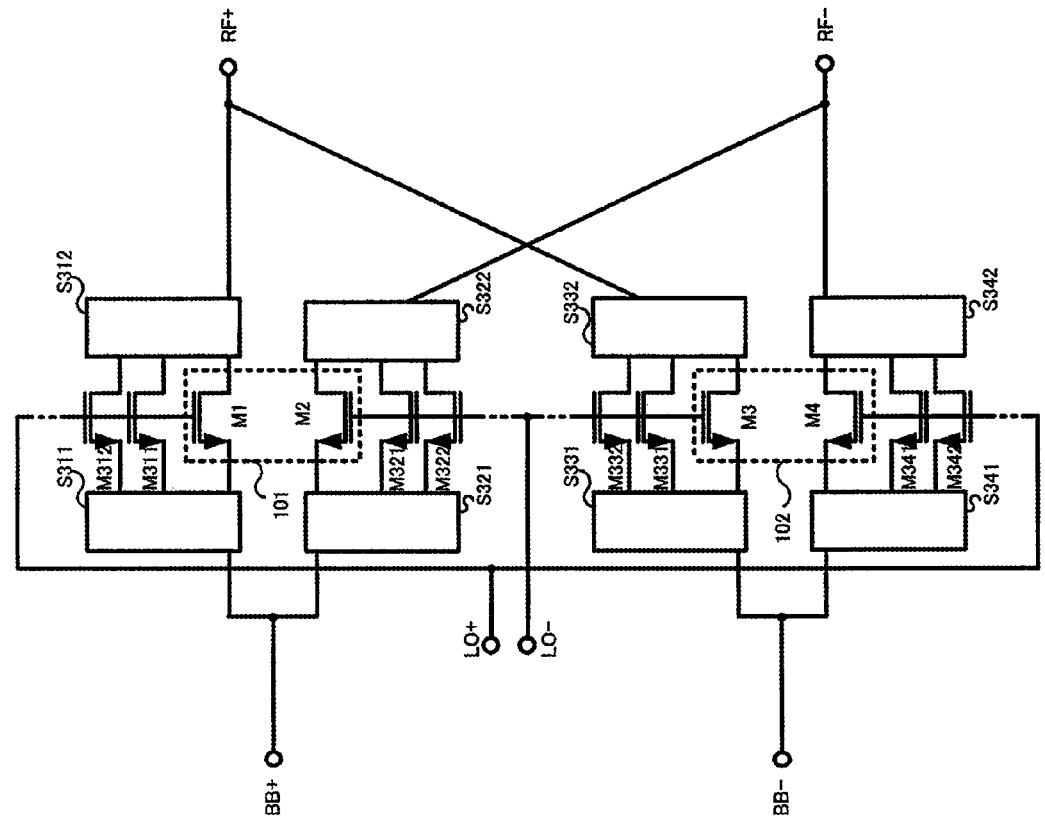
FIG. 5 is a diagram showing a configuration of a frequency converter 300 according to a third embodiment.
Figure 8:
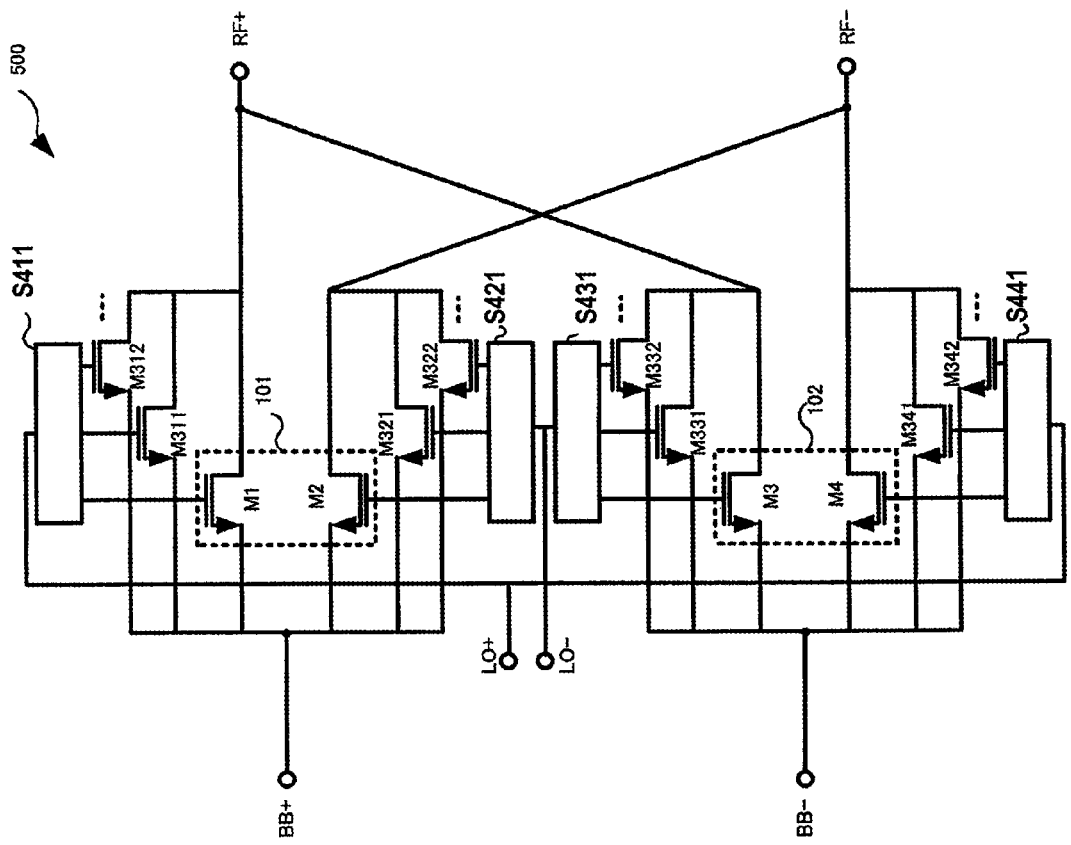
FIG. 8 is a diagram showing a configuration of a frequency converter 500 according to a fourth embodiment.

As shown in FIG. 8, the frequency converter 500 does not include the 5-1-th to 8-1-th switching units S311 to S341 as shown in FIG. 5. Further, the frequency converter 500 includes 15-th to 18-th switching units S411 to S441, instead of the 5-2-th to 8-2-th switching units S312 to S342.

One terminal of the 15-th switching unit S411 is connected to the positive-phase local terminal LO+. Other terminal of the 15-th switching unit S411 is connected to the first transistor M1 and the 5-s-th transistors M31s. The 15-th switching unit S411 selects a transistor to be connected to the positive-phase local terminal LO+ among the first transistor M1 and the 5-s-th transistors M31s, according to an instruction from a control unit (not shown).

One terminal of the 16-th switching unit S421 is connected to the negative-phase local terminal LO−. Other terminal of the 16-th switching unit S421 is connected to the second transistor M2 and the 6-s-th transistors M32s. The 16-th switching unit S421 selects a transistor to be connected to the negative-phase local terminal LO− among the second transistor M2 and the 6-s-th transistors M32s, according to an instruction from a control unit (not shown).

One terminal of the 17-th switching unit S431 is connected to the negative-phase local terminal LO−. Other terminal of the 17-th switching unit S431 is connected to the third transistor M3 and the 7-s-th transistors M33s. The 17-th switching unit S431 selects a transistor to be connected to the negative-phase local terminal LO− among the third transistor M3 and the 7-s-th transistors M33s, according to an instruction from a control unit (not shown).

One terminal of the 18-th switching unit S441 is connected to the positive-phase local terminal LO+. Other terminal of the 18-th switching unit S441 is connected to the fourth transistor M4 and the 8-s-th transistors M34s. The 18-th switching unit S441 selects a transistor to be connected to the positive-phase local terminal LO+ among the fourth transistor M4 and the 8-s-th transistors M34s, according to an instruction from a control unit (not shown).

The configuration and operation of the 15-th to 18-th switching units S411 to S441 is same as the switching unit of FIG. 6, then the description is mitted. According to the fourth embodiment, the frequency converter 500 can achieve same effects as them of the third embodiment, by using the 15-th to 18-th switching units S411 to S441 connected to a gate terminal of a transistor instead of the switch connected to a drain terminal. The configuration and operation of the 15-th to 18-th switching units S411 to S441 may be same as the switching unit of FIG. 7. In the case of a switch turning off, while the drain terminal of the transistor is opened in FIGS. 6, 7, the drain terminal may be connected to a ground. The frequency converter 500 may include the 5-1-th to 8-1-th switching unit S312 to S342 as same as FIG. 5.

Modified Example

Figure 9:
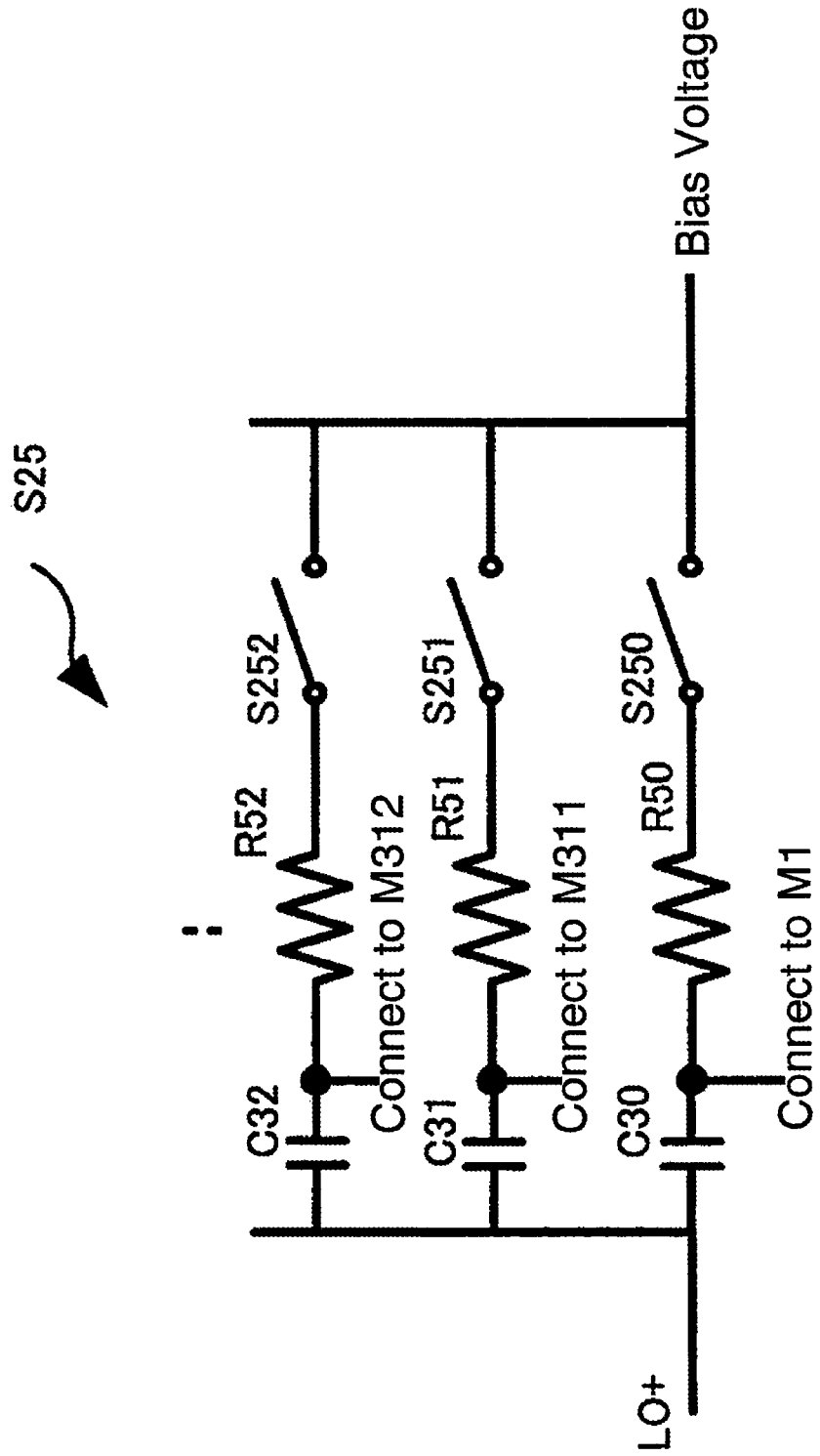
FIG. 9 is a diagram showing an example of a 25-th switching unit S25.

A modified example of the fourth embodiment is described with reference to FIG. 9. A frequency converter 600 (not shown) according to the modified example includes the 25-th to 28-th switching units S25 to S28, instead of the 15-th to 18-th switching units S411 to S441.

One terminal of the 25-th switching unit S25 is connected to the gate terminal of the first transistor M1 and the 5-s-th transistors M31s. One terminal of the 26-th switching unit S26 is connected to the gate terminal of the second transistor M2 and the 6-s-th transistors M32s. One terminal of the 27-th switching unit S27 is connected to the gate terminal of the third transistor M3 and the 7-s-th transistors M33s. One terminal of the 28-th switching unit S28 is connected to the gate terminal of the fourth transistor M4 and the 8-s-th transistors M34s. A bias voltage is added at other terminal of each of the 25-th to 28-th switching units S25 to S28. A local signal is supplied to a gate terminal of each of the 5-s-th to 8-s-th transistors M31s to M34s.

The detail of the 25-th switching unit S25 is described with reference to FIG. 9. The 25-th switching unit S25 includes 5-k-th resistors R5k, 25-k-th switches S25k, and 5-k-th capacitors C3k. One terminal of the 5-k-th resistors R5k is connected to a gate terminal of the first transistor M1 and the 5-s-th transistors M31s. One terminal of the 25-k-th switches S25k is connected to other terminal of the 5-k-th resistors R5k. A bias voltage is added at other terminal of the 25-k-th switches S25k. One terminal of the 5-k-th capacitors C3k is connected to the gate terminal of the first transistor and the 5-s-th transistors M31s, and further to one terminal of the 5-k-th resistors R5k. The local signal is supplied to other terminal of the 5-k-th capacitors C3k. The 25-th switch S25 selects a transistor at which the bias voltage is added among the first transistor M1 and the 5-s-th transistors M31s, according to an instruction from a control unit (not shown).

A bias voltage Vb is set as satisfying Vb>Vg/2−Vlo, where Vg is a gate threshold voltage of a transistor and Vlo is a zero peak voltage of a local signal. If the bias voltage Vb is added at the gate terminal of the transistor, the local signal and an input signal is mixed at the transistor. If the bias voltage Vb is not added at the gate terminal of the transistor (this case is not shown), a voltage is added as that the transistor is not activated. If the 25-k-th switches S25k is turned on according to an instruction from a control unit (not shown), the bias voltage Vb is added at any one gate terminal of the first transistor M1 and the 5-k-th transistors M31k. The configuration and operation of the 26-th to 28-th switching units S26 to S28 is same as the 25-th switch S25.

According to the modified example, the frequency converter 600 can achieve the same effects as them of the frequency converter 500 of the fourth embodiment, by using the 25-th to 28-th switching unit S25 to S28. Further, the frequency converter 600 prevents the local signal from flowing into the 25-th to 28-th switching unit S25 to S28 by adding resistors to the 25-th to 28-th switching units S25 to S28. In the modified example, it is not switched by a switch whether or not the local signal is supplied to the gate terminal, but the local signal is always supplied to the gate terminal and it is switched by a switch whether the transistor is activated or inactivated. In the case of that the local signal is supplied by the switch, the local signal may attenuate. The frequency converter 600 can avoid this attenuation by absence of a switch between the local input terminal and the gate terminal of the transistor.

In this modified example described above, the number of the transistors to mix an input signal and the local signal is only one. However, the number of the transistors may be more than one as shown in FIG. 8.

DESCRIPTION OF THE SIXTH EMBODIMENT

Figure 10:
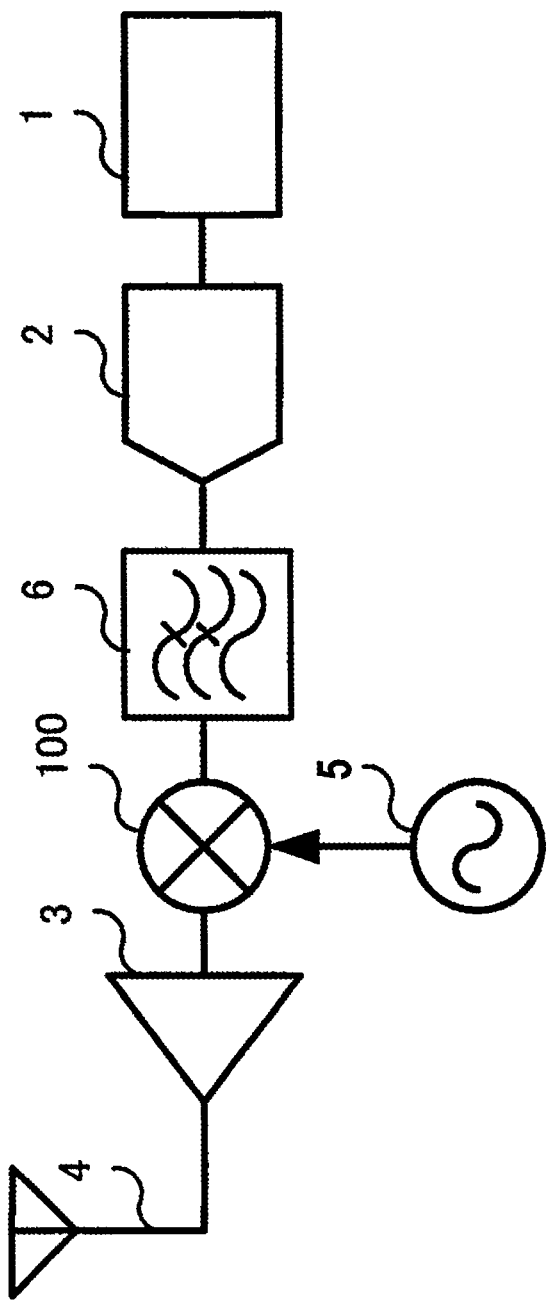
FIG. 10 is a diagram showing a configuration of a transmitter according to a sixth embodiment.

A sixth embodiment is described with reference to FIG. 10. FIG. 10 is a diagram showing a configuration of a transmitter according to the sixth embodiment. The transmitter includes a signal processing unit 1, a D/A (digital/analog) converter 2, a filter 6, the frequency converter 100 shown in FIG. 1, an amplifier 3, an antenna 4, and a local oscillator 5.

The signal processing unit 1 generates a digital baseband signal. The D/A converter 2 converts the digital baseband signal into an analog baseband signal. The filter 6 cuts a part of the analog baseband signal which is unnecessary band to obtain a filtered baseband signal. The frequency converter 100 converts a frequency of the filtered baseband signal into another frequency by using a local signal to obtain a transmission signal. The local signal is generated by the local oscillator 5. For example, the local oscillator 5 generates local signals, which each having a different frequency, according to an instruction from the signal processing unit 1. The amplifier 3 amplifies the transmission signal to generate a radio signal. The radio signal is transmitted a destination apparatus (not shown) through the antenna 4.

In common, if the frequency of the local signal varies, an input impedance of a passive-typed double balance mixer varies. Accordingly, a performance of the filter 6 also varies. On the other hand, the transmitter using the frequency converter 100 inhibits varying the input impedance of the frequency converter 100, even if the local signal having a different frequency is inputted. Therefore, the transmitter using the frequency converter 100 can keep the performance of the filter 6 to be constant.

In the sixth embodiment, the transmitter uses the frequency converter 100 of FIG. 1. Also, a receiver may use the frequency converter 100. Moreover, the transmitter may be provided using any one of the frequency converters 200 to 600.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and spirit of the inventions.

What is claimed is:

1. A frequency converter for converting frequencies of a positive-phase input signal and a negative-phase input signal into other frequencies to obtain a positive-phase output signal and a negative-phase output signal, the positive-phase input signal being inputted into a positive-phase input terminal, the negative-phase input signal being inputted into a negative-phase input terminal, the positive-phase output signal being outputted from a positive-phase output terminal and the negative-phase output signal being outputted from a negative-phase output terminal, comprising:
a first pair of transistors including a first transistor and a second transistor, the first transistor including
a source terminal being connected to the positive-phase input terminal,
a drain terminal being connected to the positive-phase output terminal, and
a gate terminal being supplied with a positive-phase local signal; and
the second transistor including
a source terminal being connected to the positive-phase input terminal,
a drain terminal being connected to the negative-phase output terminal, and
a gate terminal being supplied with a negative-phase local signal;
a second pair of transistors including a third transistor and a fourth transistor, the third transistor including
a source terminal being connected to the negative-phase input terminal,
a drain terminal being connected to the positive-phase output terminal, and
a gate terminal being supplied with the negative-phase local signal; and
the fourth transistor including
a source terminal being connected to the negative-phase input terminal, and
a drain terminal being connected to the negative-phase output terminal, and
a gate terminal being supplied with the positive-phase local signal;
a variable impedance circuit having an impedance value depending on frequencies of the positive-phase local signal and the negative-phase local signal, one terminal being connected to the positive-phase input terminal, and other terminal being connected to the negative-phase input terminal, wherein
the variable impedance circuit includes a plurality of resistor units,
each resistor unit including
a first resistor having one terminal being connected to the positive-phase input terminal and other terminal,
a second resistor having one terminal being connected to the negative-phase input terminal and other terminal, and a switch connected between the other terminals of the first resistor and the second resistor, and capable to turn ON and OFF, and the variable impedance circuit is capable to vary the impedance value by turning the switches of the resistor units ON and OFF, wherein the variable impedance circuit turns the switches ON and OFF to satisfy a resistance value $R=(1/Z-4fLO*Cgd)^{-1}$, where fLO is a frequency of the positive-phase local signal and the negative-phase local signal, Z is an input impedance value at between the positive-phase input terminal and the negative-phase input terminal, Cgd is a capacity between the gate terminal and the drain terminal of each of the first to fourth transistors.

2. The frequency converter of claim 1, wherein
the variable impedance circuit includes a first capacitor unit and a second capacitor unit, the first capacitor unit including
a plurality of first capacitors,
a first switch having one terminal being connected to the positive-phase input terminal, other terminal being connected to the first capacitors, and capable to turn ON and OFF depending on a value of the positive-phase local signal,
a second switch having one terminal being connected to the negative-phase input terminal, other terminal being connected to the first capacitors, and capable to turn ON and OFF depending on the value of the positive-phase local signal, and
a third switch having one terminal being connected to the other terminal of the first switch, other terminal being connected to the other terminal of the second switch, and alternately turning the first switch and the second switch ON and OFF depending on a value of the negative-phase local signal, and the second capacitor unit including
a plurality of second capacitors,
a fourth switch having one terminal being connected to the positive-phase input terminal, other terminal being connected to the second capacitors, and capable to turn ON and OFF depending on the value of the negative-phase local signal,
a fifth switch having one terminal being connected to the negative-phase input terminal, other terminal being connected to the second capacitors, and capable to turn ON and OFF depending on the value of the negative-phase local signal, and
a sixth switch having one terminal being connected to the other terminal of the fourth switch, other terminal being connected to the other terminal of the fifth switch, and alternately turning the fourth switch and the fifth switch ON and OFF depending on the value of the positive-phase local signal.

3. The frequency converter of claim 2, wherein
the variable impedance circuit has a capacitance value Cv of each of the first and second capacitor units to satisfy $Cv=1/(Z*fLO)-4*Cgd$, where fLO is a frequency of the positive-phase local signal and the negative-phase local signal, Z is an input impedance value at between the positive-phase input terminal and the negative-phase input terminal, Cgd is a capacity between the gate terminal and the drain terminal of each of the first to fourth transistors.

* * * * *